(12) United States Patent
Wang

(10) Patent No.: US 7,764,614 B2
(45) Date of Patent: Jul. 27, 2010

(54) MULTI-MODE MANAGEMENT OF A SERIAL COMMUNICATION LINK

(75) Inventor: Kuo-Shu Wang, Union City, CA (US)

(73) Assignee: LSI Corporation, Milpitas, CA (US)

( * ) Notice: Subject to any disclaimer, the term of this patent is extended or adjusted under 35 U.S.C. 154(b) by 1074 days.

(21) Appl. No.: 11/280,590

(22) Filed: Nov. 15, 2005

(65) Prior Publication Data

US 2007/0110086 A1  May 17, 2007

(51) Int. Cl.
*G08C 15/00* (2006.01)
(52) U.S. Cl. .................. 370/235; 370/412; 370/537; 370/545; 709/233
(58) Field of Classification Search .......... 370/535, 370/536, 537, 506, 515, 366, 412, 229, 231–236, 370/542–545; 710/71, 260; 331/1 A; 380/210; 375/354; 700/4; 709/250, 230–235, 246; 713/193
See application file for complete search history.

(56) References Cited

U.S. PATENT DOCUMENTS

| | | | | |
|---|---|---|---|---|
| 4,156,798 A * | 5/1979 | Doelz | ............................ | 700/4 |
| 4,692,894 A * | 9/1987 | Bemis | ......................... | 370/545 |
| 4,928,275 A * | 5/1990 | Moore et al. | ................. | 370/506 |
| 5,307,028 A * | 4/1994 | Chen | ........................... | 331/1 A |
| 5,598,442 A * | 1/1997 | Gregg et al. | ................. | 375/354 |
| 5,923,667 A * | 7/1999 | Poiraud et al. | ............... | 370/515 |
| 6,115,775 A * | 9/2000 | Ross et al. | .................... | 710/260 |
| 6,628,679 B1 * | 9/2003 | Talarek | ...................... | 370/536 |
| 6,977,897 B1 * | 12/2005 | Nelson et al. | ............... | 370/235 |
| 7,003,059 B1 * | 2/2006 | Susnow et al. | .............. | 709/232 |
| 2003/0051151 A1 * | 3/2003 | Asano et al. | ................. | 713/193 |
| 2003/0112798 A1 * | 6/2003 | Ziegler et al. | ............... | 370/366 |
| 2003/0126297 A1 * | 7/2003 | Olarig et al. | ................. | 709/250 |
| 2004/0022389 A1 * | 2/2004 | Shen-Orr et al. | ............. | 380/210 |
| 2004/0246953 A1 * | 12/2004 | Muth et al. | .................. | 370/366 |
| 2005/0083957 A1 * | 4/2005 | Ilnicki et al. | ................. | 370/412 |

* cited by examiner

*Primary Examiner*—Kwang B Yao
*Assistant Examiner*—Jeffrey M Rutkowski
(74) *Attorney, Agent, or Firm*—Cochran Freund & Young LLC

(57) ABSTRACT

The present invention provides a method and an apparatus for providing data management between a serial interface and another component. A variable rate buffer manager and state machine progress data on a serial link relative to a width and clocking frequency of a parallel bus that interfaces within the serial link. Event scheduler logic is provided that controls the mode of operation of the buffer manager and state machine.

10 Claims, 4 Drawing Sheets

MULTI-MODE MANAGEMENT OF A SERIAL COMMUNICATION LINK

BACKGROUND

A. Technical Field

The present invention relates generally to signal processing, and more particularly, to the management of a serial communication link between two components, such as a serializer/deserializer ("SERDES") and a transceiver.

B. Background of the Invention

In a communication device, data can be transmitted from one component to another component by a serial or parallel data transfer. With the rapid improvement in networking technologies, there is a great demand for high speed component-to-component communication rates in order to move larger amounts of data more efficiently within a networking device.

High-speed serial links are being interfaced between networking components to achieve these communication rate increases. The actual data rates on these links may be defined by various protocols and standards, such as the System Packet Interface Level 4 (SPI-4) protocol that covers a spectrum of 622 Mb/s to rates above 1 Gb/s.

A SERDES may interface a parallel data bus with a serial link by effectively serializing or deserializing a data signal. SERDES technology has become very important as data rates have continually increased because a very fast serial link may be converted to a deserialized signal that can be more easily transmitted and processed on a parallel data bus.

FIG. 1 illustrates an exemplary SERDES and interfacing component(s) according to one embodiment of the invention. In this particular example, a SERDES 101 interfaces either a 64 or 128 bit parallel bus 103 to a serial data link 105. The serial data link 105 is also coupled to a transceiver 102. In the operation of a system, the rate of the system core logic may operate at a different rate than the serial data link 105 because of the parallel transfer of data to the core logic.

In one example, the SERDES 101 serial interface receives an 8-bit data stream clocked at 500 MHz and forwards the data to the core logic in a 16-bit data stream clocked at 250 MHz. The clock difference between the SERDES 101 interface and the system core logic may be synthesized and mapped to a structure such as an ASIC or FPGA located within the data path to compensate for this clock mismatch. However, if the same serial interface on the SERDES 101 receives an 8-bit data stream clocked at 1 GHz, then the system core logic needs to be clocked at 500 MHz to properly process a corresponding 16-bit data stream.

Current ASIC and FPGA technology is unable to cost effectively provide an ASIC or FPGA that achieves the required clocking speed of 500 MHz or above for core logic processing. In order to increase the required data rate at the system core logic, the width of the parallel data bus may be expanded by a factor of two. Consequently, in this particular example, the parallel data bus may be expanded to 64-bit or wider to reduce the required internal core logic clocking speed.

The principle of expanding parallel data bus width may be extrapolated to achieve higher data rates without having to increase a corresponding clocking speed. For example, the 64-bit parallel bus could be changed to a 128-bit or 256-bit to reduce the clock frequency of 500 MHz to half or one-fourth respectively.

One current solution in which variable width data buses are provided is by generating multiple system design versions in which different inputs and clock frequencies are associated with each clocking speed and input. However, creating multiple version of a system design may become logistically difficult because of the creation and maintenance of multiple source codes related to the design. Further, the verification environment and process may become overly complicated which may require support engineers to update patches for multiple customers using different versions of the system design.

Therefore there is a need for providing a single system design that allows multiple parallel data widths and clock inputs in order to facilitate the speed matching of a component, such as core logic, to the serial interface of a SERDES or other component.

SUMMARY OF THE INVENTION

A system, apparatus and method that provide data management between a serial interface and other component are described. In one embodiment, the present invention may manage a data stream between a SERDES and a transceiver. A variable length serial data stream is received at a buffer manager located between the SERDES and transceiver. The data within the buffer manager is controlled by a state machine that is advanced by event scheduler logic. The event scheduler logic provides different modes in which variable rate data streams may be communicated between the SERDES and the transmitter.

In one embodiment of the invention, a 64-bit data stream or 128-bit data stream may be communicated on a serial link between a SERDES and transceiver. A buffer manager is serially coupled within the serial link to allow the serial transmission of data in two different modes corresponding to the two different bus widths at the parallel interface of the SERDES. A state machine interfaces with the buffer manager and event scheduler logic to facilitate the different data streams. The state machine progresses data within the bit stream at multiple rates according to the mode in which it operates.

The event scheduler may operate in a plurality of different modes depending on the rate at which data needs to be communicated on the serial link. In one mode, the state machine may progresses data on the serial link at every cycle of a core clock rate provided by the event scheduler logic and an internal clock. In a second mode, the state machine may progresses data on the serial link at every other cycle of the core clock rate; thereby effectively reducing the effective data rate on the serial link by a factor of two. Reset logic may also be provided and coupled to the event scheduler to further control the event scheduler.

Other objects, features and advantages of the invention will be apparent from the drawings, and from the detailed description that follows below.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF THE PREFERRED EMBODIMENTS

In the following description, for purpose of explanation, specific details are set forth in order to provide an understanding of the invention. It will be apparent, however, to one skilled in the art that the invention may be practiced without these details. One skilled in the art will recognize that embodiments of the present invention, some of which are described below, may be incorporated into a number of different computing systems and devices. The embodiments of the present invention may be present in hardware or firmware. Structures and devices shown below in block diagram are illustrative of exemplary embodiments of the invention and are meant to avoid obscuring the invention. Furthermore, connections between components within the figures are not intended to be limited to direct connections. Rather, data between these components may be modified, reformatted or otherwise changed by intermediary components.

Reference in the specification to "one embodiment" or "an embodiment" means that a particular feature, structure, characteristic, or function described in connection with the embodiment is included in at least one embodiment of the invention. The appearances of the phrase "in one embodiment" in various places in the specification are not necessarily all referring to the same embodiment.

A. Overview

A system, apparatus and a method for managing the communication of data between a serial interface on a SERDES and other component, such as a transceiver, are disclosed. This actual management of data may depend on the bus width that is coupled to the parallel interface on the SERDES.

A buffer manager is serially coupled within a communication link between the SERDES and other component. The buffer manager is coupled to a state machine and event scheduler logic that operate in one of a plurality of modes associate with different parallel bus widths at the other side of the SERDES. In particular, the event scheduler controls the rate at which the state machine progresses data on the serial link. In one embodiment, the state machine may operate at a core clocking rate, or fraction thereof, depending on the mode in which it is currently operating.

The variable rate of data progression on the serial link allows the link to interface, via a SERDES, with multiple buses having different widths and associated clocking rates.

B. Multi-Mode Buffer Manager and Event Scheduler Logic

Figure 1:
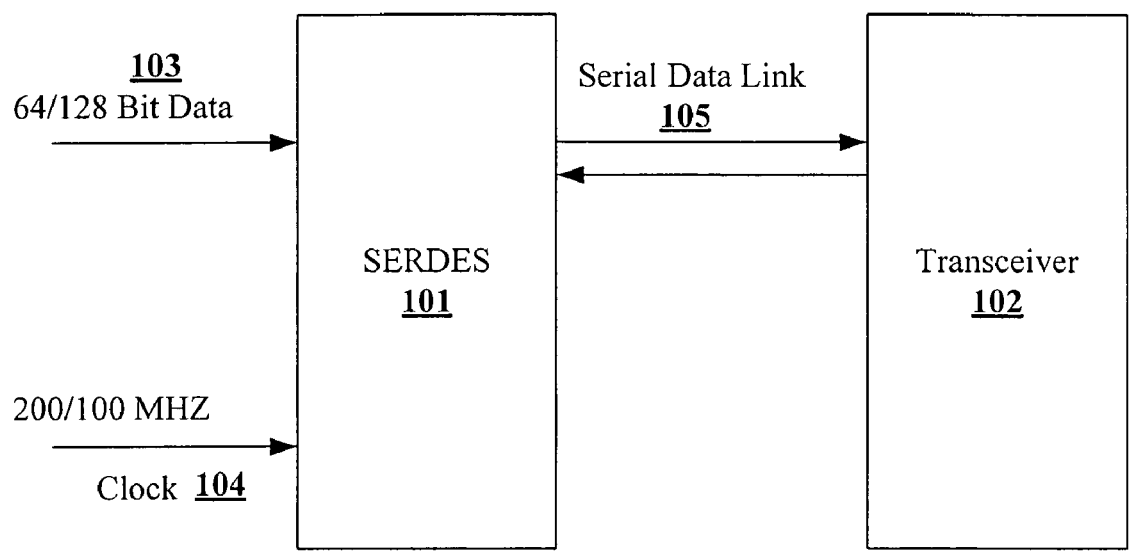
FIG. 1 illustrates a prior art system where a serial interface on a SERDES is communicating a serial data stream at a particular data rate.
Figure 2:
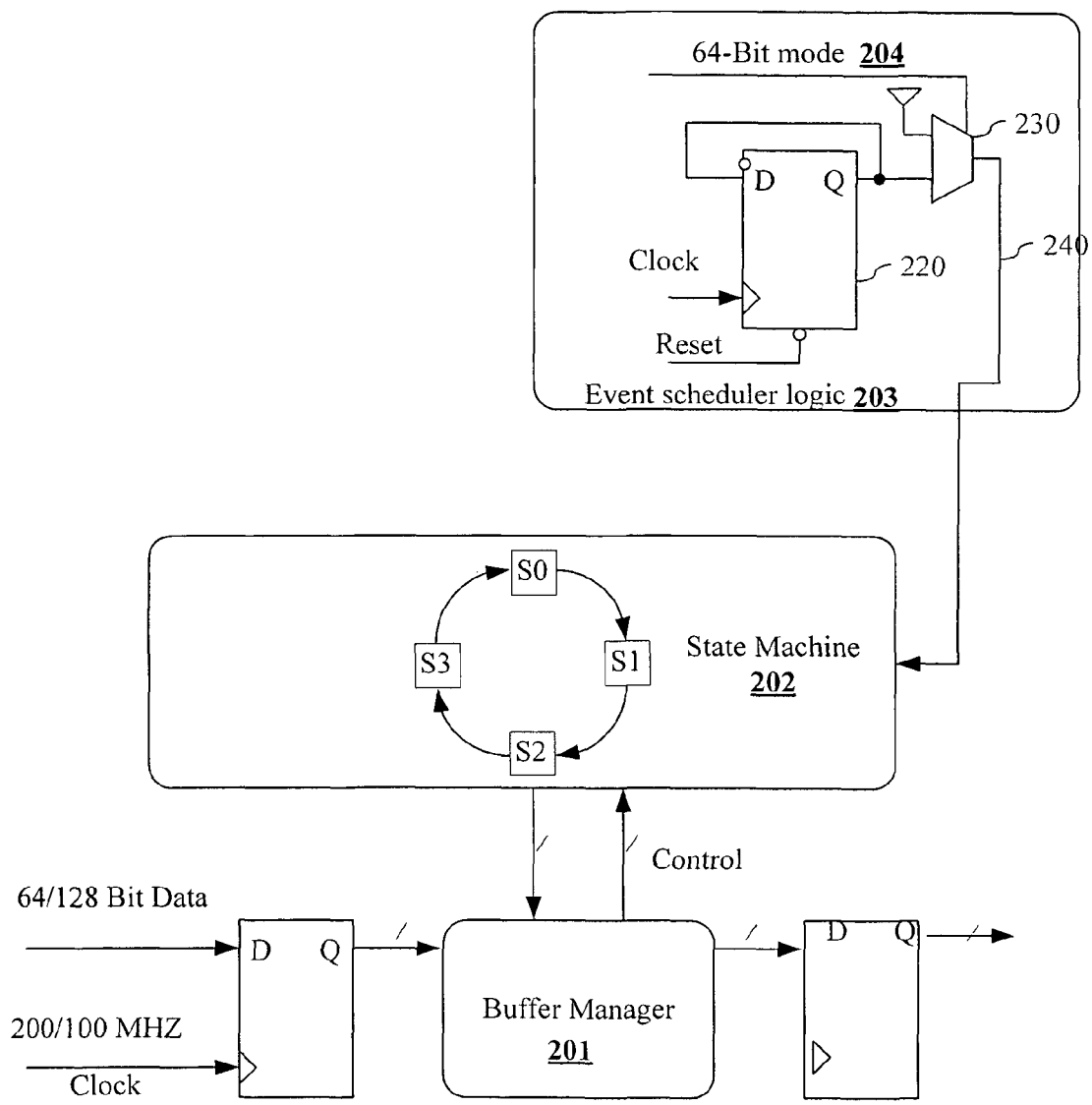
FIG. 2 illustrates a variable data rate serial communication link operating in a first mode between a SERDES and another component according to one embodiment of the invention.

FIG. 2 illustrates a multi-mode buffer manager and event scheduler logic operating in a first mode. In this particular embodiment, the first mode 204 operates at a rate associated with a 64-bit parallel bus clocked at a particular rate. However, this first mode may operate within other parallel buses such as a 128-bit, 256-bit or 512-bit buses depending on the particular application of the serial communication link. Event schedule logic 203, a state machine 202 and a buffer manager 201 are shown.

The progression of data through the buffer manger 201 is controlled by the state machine 202, which in turn is enabled or disabled by event scheduler logic 203. The event scheduler logic 203 advances events or data progressions of the state machine 202 according to a timing signal 240 provided to the event scheduler logic 203. This timing signal 240 may be generated by processing an internal clock and associating a particular clocking speed of the mode in which the buffer manager 201 and state machine 202 are operating. For example, in one embodiment of the invention, flip-flop 220 and multiplexer 230 combinations are used to create the timing signal 240 that is proportional to a core clocking rate of the internal clock. In particular, the multiplexer 230 may generate the timing signal 240 being equal to the core clocking rate or fractionally slower than the core clocking rate depending on a mode of operation that is selected. One skilled in the art will recognize that the effective rate at which the data progresses through the buffer manager and state machine may vary over a wide range of data widths and clocking speeds; all of which may be effectively generated and addressed by the present invention.

The multiplexer 230, within the event scheduler logic 203, receives a series of alternating bits from the flip-flop 220 at a particular core clock rate. A select line is coupled to the multiplexer 230 that controls its output. This multiplexer output is the timing signal 240 that controls the rate at which the state device 202 progresses data on the link. The number of select lines may be increased to increase the number of modes and effective data rates in which the state device 202 may operate. One skilled in the art will recognize that various other components and digital logic combinations, including AND, OR, NOR and NAND gates, may be used to control the rate at which the timing signal 240 is sent.

Reset functionality may be included within the event scheduler 203 to allow a user to reset the system. In this particular embodiment, a reset pin located on the flip-flop 220 is shown.

Figure 3:
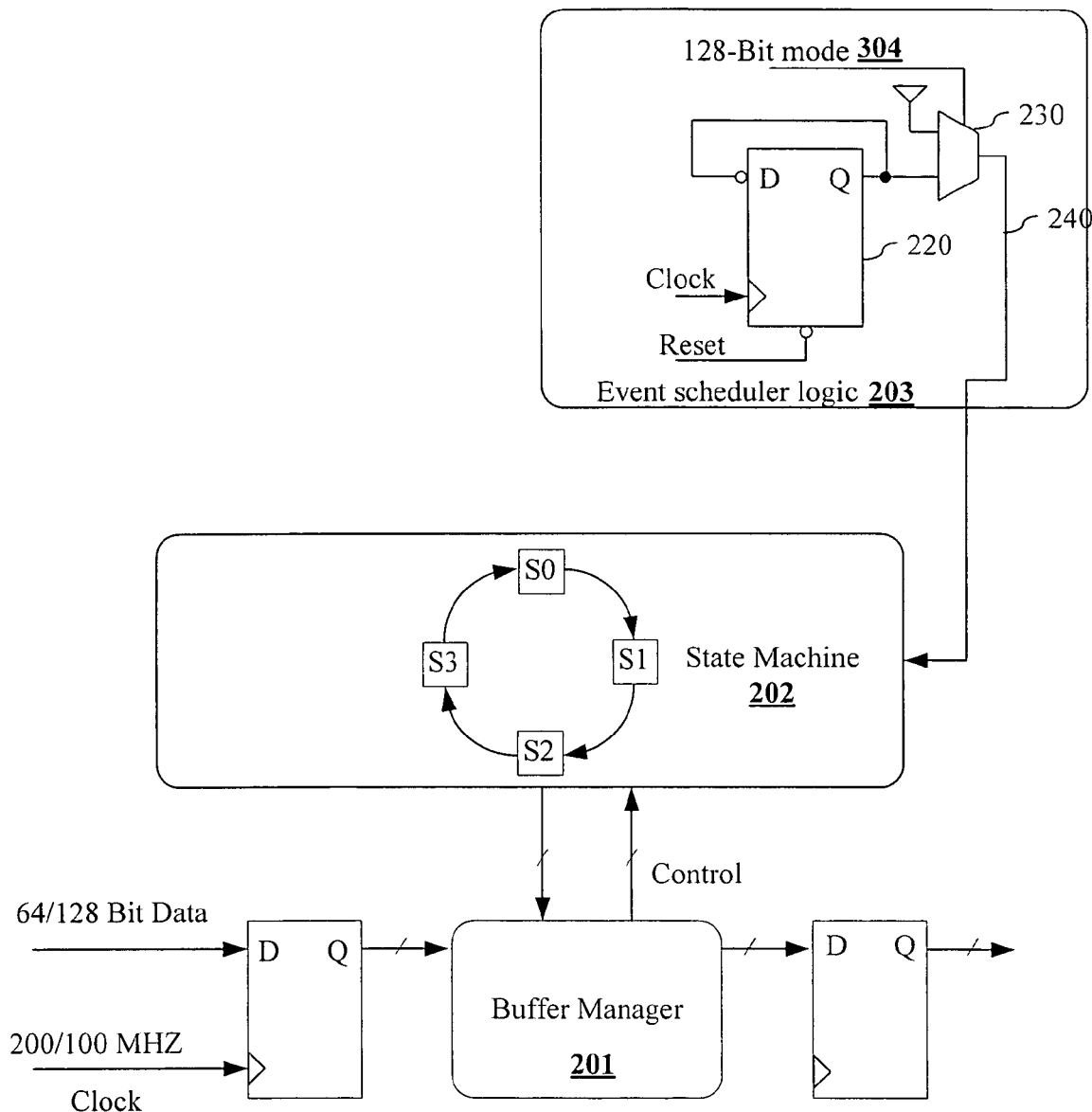
FIG. 3 illustrates a variable data rate serial communication link operating in a second mode between a SERDES and another component according to one embodiment of the invention.

FIG. 3 illustrates the present invention operating in a second mode in which data is communicated on a serial link at a rate slower than the core clock. For example, this second mode may be a 128-bit mode, in which the rate on the serial link would be half of the rate on the link in the 64-bit mode described above.

In this particular embodiment, the 128-bit mode is set on the select line on the digital logic 230 within the event scheduler logic 203. By asserting the value "1" on the output line, the mode of operation for the state machine 202 and the data manager 201 is changed accordingly.

The combination of the state machine 202 and event scheduler logic 203 allows for a single design for a variable rate serial communication link that can be interfaced with buses having different widths. By effectively changing the rate at which the state machine 202 progresses data or cycles through "an event," the rate of the serial link is modified allowing for multiple bus widths and frequency inputs on a device such as a SERDES.

One skilled in the art will recognize that the present invention may address various combinations of inputs operating at certain data widths and corresponding frequencies. These combinations may be associated with a rate on the state machine 202 that defines data progression or events occurring in various clocking cycles.

C. State Machine Operation of 64-Bit Mode and 128-Bit Mode

Figure 4:
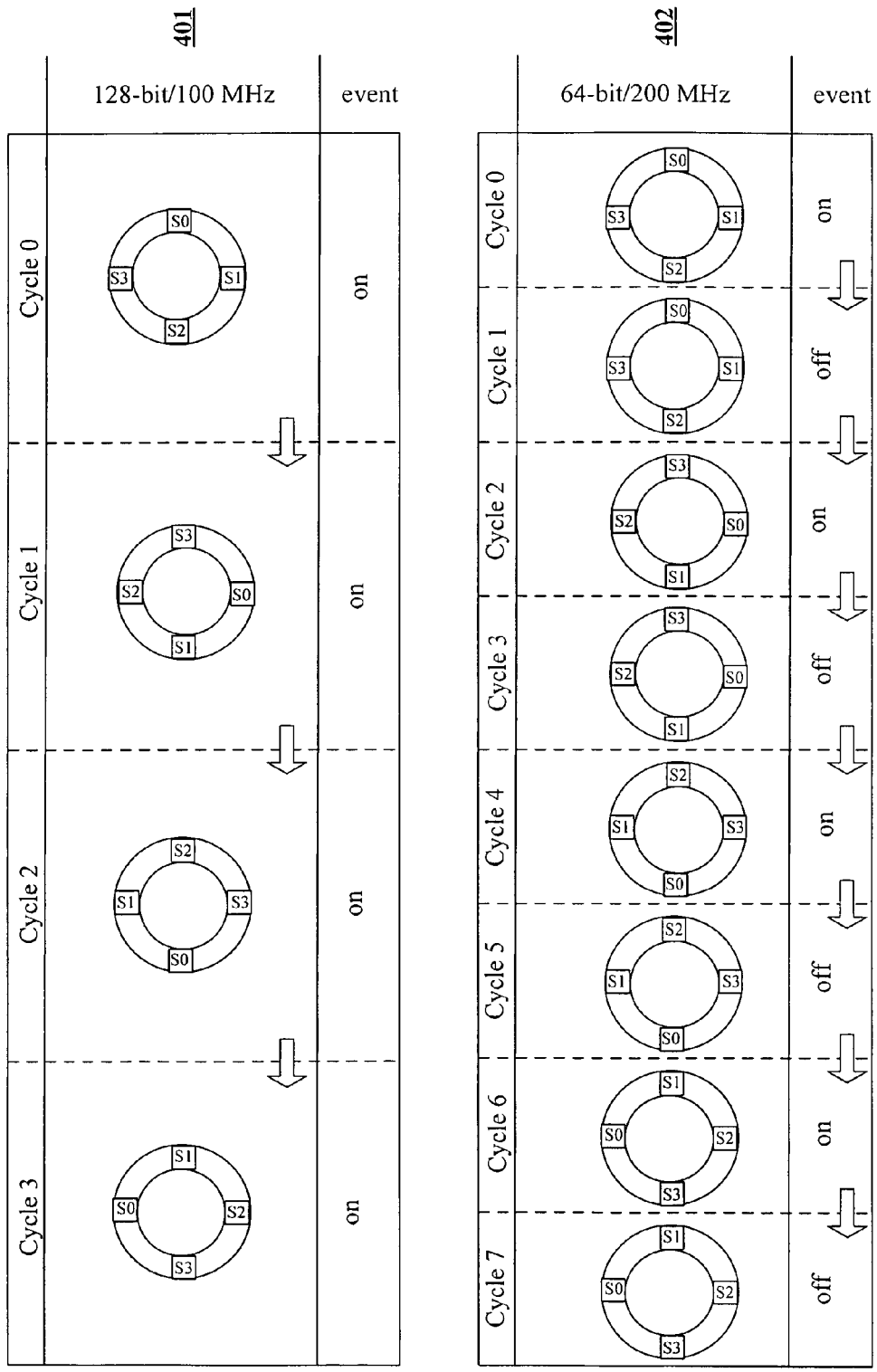
FIG. 4 shows a diagram illustrating multi-mode operation of a multi-mode buffer manager and state machine within a serial communication link according to one embodiment of the invention.

FIG. 4 illustrate the operation of the state machine 202 in both 64-bit and 128-bit modes according to one embodiment of the invention. If a 128-bit mode 401 is operating, an event or data progression occurs at an 'ON' clock cycle and the data progresses through the state machine accordingly. If a 64-bit mode 402 is operating, an event or data progression occurs at both 'ON' and 'OFF' clock cycles creating a data rate twice as fast as the 128-bit mode. One skilled in the art will recognize the scalability of the data manager 201 and state machine 202 provided by the variable data read and progression within a serial link.

In one embodiment of the invention, the operation of a 64-bit mode 402 event triggers are off in odd number of cycles. The event scheduler logic 203 is causing a state to advance through the state machine 202 at only "1" outputs of the flip-flop 220 within the event scheduler logic 203, effectively slowing down the state machine 202 by a factor of 2. Comparatively, in the operation of a 128-bit mode 401 data progresses through the state machine 202 at every clock with the select line of the multiplexer 230 turning on the event scheduler logic 203 all the time.

It may become necessary in the future to create serial links that may interface with relatively smaller bus widths than the 64-bit width described-above. By increasing the rate of the internal clock or core clocking rate, the present invention may provide such functionality.

Serial links associated with larger bus widths may be provided. For example, the flip-flop 220 may generate one cycle after every four clocks to provide a serial data rate that may be interfaced with a 256-bit wide bus. Additionally, the number of modes within the invention may be increased by increasing the number of inputs provided to the digital logic 230 within the event scheduler logic 203. For example, three modes may be provided by providing two select lines to the multiplexer.

A reset structure may be provided that synchronously de-asserts event scheduler logic 203 upon removal of the reset signal. In one embodiment of the invention, the event scheduler logic 203 and the state machine 202 may be appropriately coupled together with the same source of a reset tree.

The event scheduler logic 203 may comprise a register output that may be pipelined to improve timing closure. The event scheduler logic 203 may be controlled by static pins to match the event scheduling to an appropriate bus width. By using the static pins, different bus widths are implemented in the same IP or design core, to eliminate the need for multiple versions of the core.

The foregoing description of the invention has been described for purposes of clarity and understanding. It is not intended to limit the invention to the precise form disclosed. Various modifications may be possible within the scope and equivalence of the appended claims.

I claim:

1. A method for providing multi-mode management of a serial communication link, the method comprising:
    serially coupling a buffer manager within the serial communication link between a serial interface on a first component and a second component, wherein the buffer manager stores and progresses data from an input to an output;
    controlling the progression of data through the buffer manager using a state machine having a plurality of cycles, the state machine causing the progression of data through the buffer when a first cycle of the plurality of cycles advances to a second cycle of the plurality of cycles; and
    advancing the state machine from the first cycle of the plurality of cycles to the second cycle of the plurality of cycles according to a timing signal generated by event scheduler logic that processes an internal clock and associates a first clocking speed in which the buffer and state machine are operating to a second clock speed in which the first component is operating, the event scheduler logic comprising:
        a flip-flop having a clock input that receives the internal clock, a reset input that receives a reset signal, a data input that receives an output of the flip-flop thereby producing the timing signal that has a frequency that is less than the internal clock; and
        a multiplexer receiving the timing signal at a first input and a mode signal at a second input, and having a select line that defines the mode of operation by producing one of the timing signal and the mode signal at a multiplexer output that controls the advancement of the state machine.

2. The method of claim 1 wherein the buffer manager and state machine operate in a first mode defined as 64-bit width clocked at 200 MHz.

3. The method of claim 1 wherein the buffer manager and state machine operate in a second mode defined as a 128-bit width clocked at 100 MHz.

4. The method of claim 1 wherein the progression of the state machine occurs at a rate less than the internal clock.

5. The method of claim 1 wherein the first component is a SERDES and the second component is a transceiver.

6. A system for managing data on a serial communication link, the system comprising:
    a buffer manager, coupled within the serial communication link between a serial interface on a first component and a second component, that operates at one of a plurality of clock rates, wherein the buffer manager stores and progresses data from an input to an output;
    a state machine, controlling the buffer manager, that progresses data through the buffer manager and serial communication link according to an enable signal; and
    event scheduler logic, coupled to the state machine, that controls the advancement of the state machine based on a one of the plurality of clock rates and a clock rate in which the first component is operating, the event scheduler logic comprising:
        a flip-flop having a clock input that receives an internal clock, a reset input that receives a reset signal, a data input that receives an output of the flip-flop thereby producing a timing signal having a frequency that is less than the internal clock; and
        a multiplexer receiving the timing signal at a first input and a mode signal at a second input, and having a select line that defines the mode of operation by producing one of the timing signal and the mode signal at a multiplexer output as the enable signal that controls the advancement of the state machine.

7. The system of claim 6 wherein the enable signal is generated by dividing the frequency of the internal clock.

8. The system of claim of claim 6 wherein the event scheduler logic may select between two modes.

9. The system of claim 8 wherein the two modes have a first mode that provides a 128-bit width clocked at 100 MHz and a second mode that provides a 64-bit width clocked at 200 MHz.

10. The system of claim 6 wherein the serial communication link includes the buffer manager and communicates serial data between a SERDES and a transceiver.

* * * * *